(12) United States Patent
Wang et al.

(10) Patent No.: US 10,790,351 B2
(45) Date of Patent: Sep. 29, 2020

(54) CONDUCTIVE LEAD ARRANGEMENT FOR DISPLAY SUBSTRATE AND MANUFACTURING METHOD THEREOF, AND DISPLAY DEVICE

(71) Applicants: BOE Technology Group Co., Ltd., Beijing (CN); Ordos Yuansheng Optoelectronics Co., Ltd., Ordos (CN)

(72) Inventors: Xiaowei Wang, Beijing (CN); Guoqing Zhang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 13 days.

(21) Appl. No.: 16/177,754

(22) Filed: Nov. 1, 2018

(65) Prior Publication Data
US 2019/0252487 A1    Aug. 15, 2019

(30) Foreign Application Priority Data
Feb. 9, 2018  (CN) .......................... 2018 1 0136043

(51) Int. Cl.
*H01L 27/32* (2006.01)
*H01L 27/12* (2006.01)
(52) U.S. Cl.
CPC ........ *H01L 27/3279* (2013.01); *H01L 27/124* (2013.01); *H01L 27/3276* (2013.01); *H01L 2227/323* (2013.01)

(58) Field of Classification Search
CPC ............. H01L 27/3276; H01L 27/3279; H01L 27/3288; H01L 27/329
See application file for complete search history.

(56) References Cited

U.S. PATENT DOCUMENTS

| | | | | |
|---|---|---|---|---|
| 2005/0184927 A1* | 8/2005 | Kwak | ................. | H01L 27/3276 345/45 |
| 2010/0289729 A1* | 11/2010 | Nakamura | .......... | H01L 27/3276 345/76 |
| 2017/0194593 A1* | 7/2017 | Ma | ...................... | H01L 51/5203 |

OTHER PUBLICATIONS

Hyperphysics, Resistance and Conductivity, http://hyperphysics.phy-astr.gsu.edu/hbase/hph.html#hph, accessed via https://web.archive.org/web/20070502154037/http://hyperphysics.phy-astr.gsu.edu/hbase/electric/resis.html (Year: 2007).*

* cited by examiner

*Primary Examiner* — Lex H Malsawma
*Assistant Examiner* — Gardner W. S. Swan
(74) *Attorney, Agent, or Firm* — Fay Sharpe LLP

(57) ABSTRACT

A display substrate and a manufacturing method thereof, and a display device are provided. The display substrate includes: a voltage conducting layer, at least part of which is in a display area; a voltage connecting terminal in a peripheral circuit area, and a conductive lead in the peripheral circuit area. The conductive lead includes: a first annular portion, a second annular portion, and a plurality of bridging portions. The first annular portion is connected to the voltage conducting layer, the second annular portion surrounds the first annular portion and connected to the voltage connecting terminal, and a first end and a second end of each bridging portion are connected to the first annular portion and the second annular portion respectively.

20 Claims, 11 Drawing Sheets

CONDUCTIVE LEAD ARRANGEMENT FOR DISPLAY SUBSTRATE AND MANUFACTURING METHOD THEREOF, AND DISPLAY DEVICE

This application claims priority to Chinese Patent Application No. 201810136043.0, filed on Feb. 9, 2018 and titled "DISPLAY SUBSTRATE AND MANUFACTURING METHOD THEREFOR, AND DISPLAY DEVICE", the entire contents of which are incorporated herein by reference.

TECHNICAL FIELD

The present disclosure relates to a display substrate and a manufacturing method thereof, and a display device.

BACKGROUND

A self light-emitting display product generally adopts an active matrix (AM) driving method. That is, driving voltage or driving current is supplied for the self light-emitting device in each sub-pixel unit respectively, so that the self light-emitting device emits light according to the driving voltage or the driving current.

SUMMARY

The present disclosure provides a display substrate and a manufacturing method thereof, and a display device.

In a first aspect, there is provided a display substrate, comprising: a voltage conducting layer, at least part of the voltage conducting layer being located in a display area; a voltage connecting terminal located in a peripheral circuit area, the peripheral circuit area surrounding the display area; and a conductive lead located in the peripheral circuit area; wherein the conductive lead comprises: a first annular portion surrounding the display area and connected to the voltage conducting layer; a second annular portion surrounding the first annular portion and connected to the voltage connecting terminal; and a plurality of bridging portions, wherein a first end of each of the bridging portions is connected to the first annular portion, a second end of each of the bridging portions is connected to the second annular portion, and a resistance value between the first end and the second end of each of the bridging portions is negatively correlated to a resistance value between the second end of the bridging portion and the voltage connecting terminal.

In a possible implementation, the resistance value between the second end of each of the bridging portions and the voltage connecting terminal is negatively correlated to a length of the bridging portion in a first direction, and the first direction is a direction from the first end of the bridging portion to the second end of the bridging portion.

In a possible implementation, the resistance value between the second end of each of the bridging portions and the voltage connecting terminal is positively correlated to a length of the bridging portion in a second direction, the second direction is a direction perpendicular to a first direction, and the first direction is a direction from the first end of the bridging portion to the second end of the bridging portion.

In a possible implementation, the display substrate further comprises at least one of a gate conductive layer and a source-drain conductive layer, and at least one of the gate conductive layer and the source-drain conductive layer and at least part of the conductive lead are formed by the same mask process.

In a possible implementation, each of the bridging portions is located between the first annular portion and the second annular portion.

In a possible implementation, part of the voltage conducting layer is located in the peripheral circuit area, and a surface of one side of the first annular portion in a thickness direction is in contact with a surface of one side of the voltage conducting layer in the thickness direction.

In a possible implementation, the first annular portion is in direct contact with the voltage conducting layer, and the second annular portion is in direct contact with the voltage connecting terminal.

In a possible implementation, the conductive lead further comprises at least one lead portion, and the at least one lead portion connects the second annular portion to the voltage connecting terminal.

In a possible implementation, at least one of the first annular portion and the second annular portion has a closed annular shape.

In a possible implementation, each part of the conductive lead is formed with the same material.

In a possible implementation, each part of the conductive lead is formed with the same material, and each part of the conductive lead has the same thickness on the display substrate.

In a possible implementation, the voltage conducting layer is arranged in the entire display area.

In a second aspect, there is provided a method for manufacturing a display substrate, comprising: forming a pattern comprising a voltage connecting terminal and a conductive lead, wherein the voltage connecting terminal and the conductive lead are both located in a peripheral circuit area of the display substrate; and forming a voltage conducting layer, at least part of the voltage conducting layer being located in a display area of the display substrate, and the peripheral circuit area surrounding the display area; wherein the conductive lead comprises: a first annular portion surrounding the display area and connected to the voltage conducting layer; a second annular portion surrounding the first annular portion and connected to the voltage connecting terminal; and a plurality of bridging portions, wherein a first end of each of the bridging portions is connected to the first annular portion, a second end of each of the bridging portions is connected to the second annular portion, and a resistance value between the first end and the second end of each of the bridging portions is negatively correlated to a resistance value between the second end of the bridging portion and the voltage connecting terminal.

In a possible implementation, the resistance value between e second end of each of the bridging portions and the voltage connecting terminal is negatively correlated to a length of the bridging portion in a first direction, and the first direction is a direction from the first end of the bridging portion to the second end of the bridging portion.

In a possible implementation, the resistance value between the second end of each of the bridging portions and the voltage connecting terminal is positively correlated to a length of the bridging portion in a second direction, the second direction is a direction perpendicular to a first direction, and the first direction is a direction from the first end of the bridging portion to the second end of the bridging portion.

In a possible implementation, the display substrate further comprises at least one of a gate conductive layer and a source-drain conductive layer, and at least one of the gate conductive layer and the source-drain conductive layer and at least part of the conductive lead are formed by the same mask process.

In a third aspect, there is provided a display device, comprising any of the above display substrate.

DETAILED DESCRIPTION

To make the principles and advantages of the present disclosure clearer, the embodiments of the present disclosure will be described below in further detail in conjunction with the accompanying drawings. Apparently, the described embodiments are some rather than all of the embodiments of the present disclosure. All other embodiments obtained by those of ordinary skill in the art based on the embodiments of the present disclosure without creative work shall fall within the protection scope of the present disclosure. Unless otherwise defined, technical terms or scientific terms used in the present disclosure shall have ordinary meaning as understood by those of ordinary skill in the art to which the present disclosure pertains. The term "first" or "second" or the similar term used in the present disclosure does not denote any order, quantity, or importance, but is merely used to distinguish different components. The term "comprising" or the similar term means that elements or items which appear before the term include the elements or items listed after the term and their equivalents, and do not exclude other elements or items. The term "connection" or "connected to" or the similar term which appear individually is not limited to the physical or mechanical connection but may include an electrical connection that is direct or indirect.

It can be noted that the existing self light-emitting display products are likely to have the problem of non-uniform brightness. For example, the overall brightness of pixels in an ultralong screen may gradually decrease from one side to the other side, or the brightness in the center of a large-size screen may be lower than the brightness in the periphery, etc., which seriously affects the display quality of the self light-emitting display product.

Figure 1:
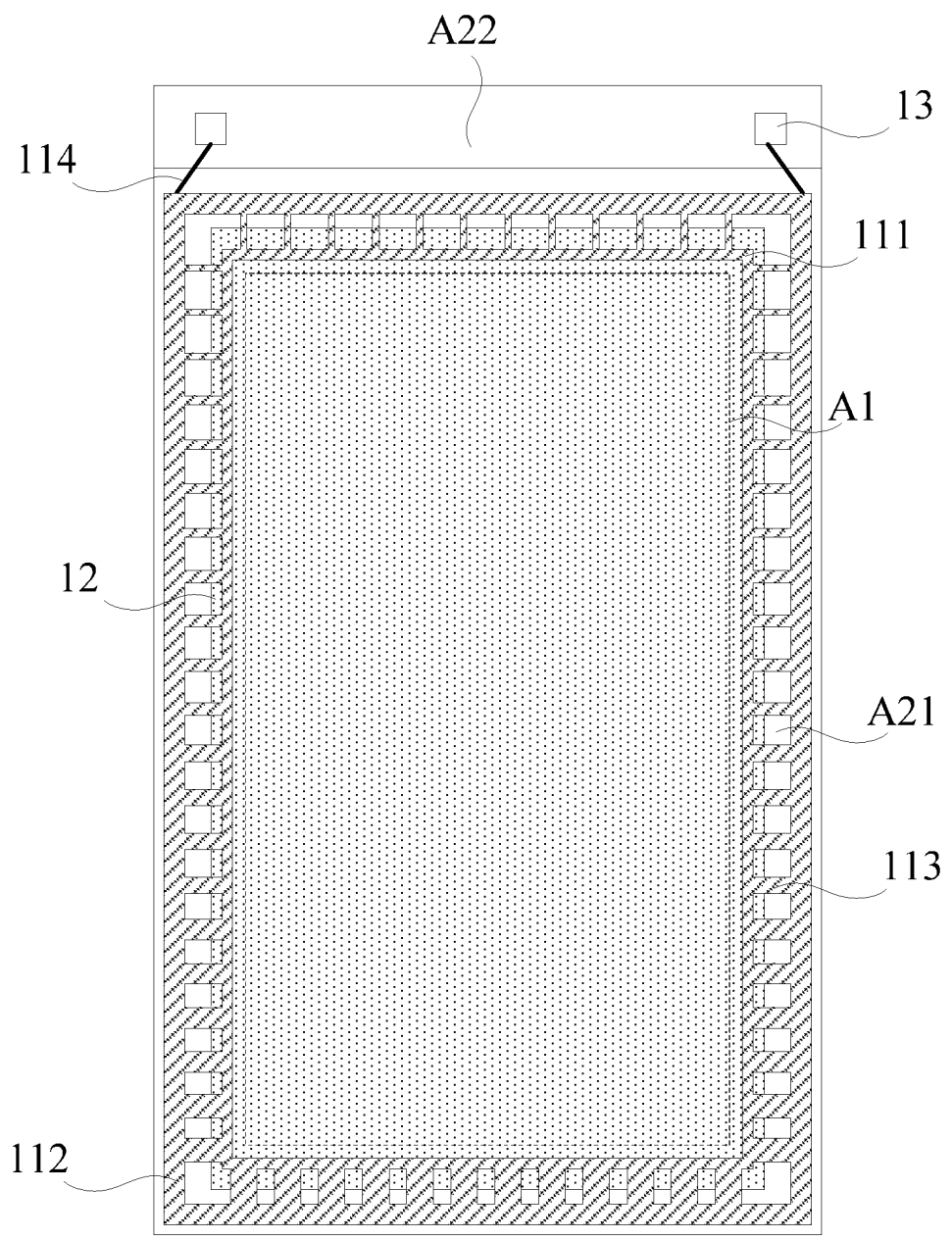
FIG. 1 is a schematic diagram of a structure of a display substrate according to an embodiment of the present disclosure.

FIG. 1 is a schematic diagram of a structure of a display substrate according to an embodiment of the present disclosure. Referring to FIG. 1, in an example, the display substrate includes a display area A1 and a peripheral circuit area, a peripheral area A21, and a circuit area A22. Here, the peripheral area A21 and the circuit area A22 form the peripheral circuit area of the display substrate. The peripheral area A21 is a substrate area surrounding the display area A1, and the circuit area A22 is an area on the display substrate for arranging a circuit structure, such as a chip. The display area A1 is disposed at the center of the base substrate (the material may be, for example, glass, silicon wafer or organic polymer, etc.) of the display substrate, and the peripheral area A21 is an area around the display area A1 on the base substrate. The circuit board is laminated on the edge of one side of the base substrate to form the circuit area A22. In another example, the display substrate does not include the circuit area A22, the display area A1 is disposed in the center of the display substrate, and the peripheral circuit area is an area on the display substrate other than the display area A1. In yet another example, the display area A1 is disposed in the center of a flexible substrate of the display substrate, the circuit area A22 is an area specially for disposing the circuit structure at the edge of one side of the flexible substrate, and the peripheral area A21 is an area surrounding the display area A1 other than the circuit area A22. Of course, for different types of display substrates (for example, a color film substrate, an array substrate, an organic light-emitting diode display panel, or other types of display panels and glass cover plates), the substrate material of the display substrate and the arrangement of each area may be not limited to the above.

As shown in FIG. 1, the display substrate further includes a conductive lead (including a first annular portion 111, a second annular portion 112, a plurality of bridging portions 113 and two lead portions 114), a voltage conducting layer 12 and two voltage connecting terminals 13. The voltage conducting layer 12 is arranged in the entire display area A1, and part of the voltage conducting layer 12 is further located in the peripheral area A21 in the peripheral circuit area at the edge of the display area A1. Based on this, the voltage conducting layer 12 can be configured to conduct corresponding voltage (for example, a cathode voltage for connecting a cathode of the light-emitting device, a common voltage for supplying a common terminal potential, a reference voltage for supplying a reference potential, and the like) into the display area A1. The two voltage connecting terminals 13 are located in the circuit area A22 in the peripheral circuit area. The above corresponding voltage can be provided to other parts in the display substrate by, for example, connecting an external interface or connecting an internal voltage converter (for example, a DC-DC converter). The conductive lead is respectively electrically connected to the voltage connecting terminals 13 and the voltage conducting layer 12 and thus can be configured to conduct the voltage from the voltage connecting terminals 13 to the voltage conducting layer 12.

In the conductive lead, the first annular portion 111 surrounds the display area A1, and the first annular portion 111 is connected to the voltage conducting layer 12. In an example, the first annular portion 111 may be disposed on the surface of one side of the voltage conducting layer 12 in the thickness direction as shown in FIG. 1, and the surface of one side of the first annular portion 111 in the thickness direction is enabled to be in contact with the surface of one side of the voltage-conducting layer 12 in the thickness direction, to increase the contact area and reduce the contact resistance in a limited layout space. In another example, the inner edge of the first annular portion 111 is in contact with the upper surface of the voltage conducting layer 12, and the outer edge of the first annular portion 111 surrounds the voltage conducting layer 12, such that the remaining part of the conductive lead can have a relatively small difference in height, which helps to reduce the resistance during voltage conduction and reduce the probability of defects in the conductive lead. It should be understood that the first annular portion 111 is a part of the conductive lead which directly supplies voltage to the voltage conducting layer 12, and the way in which the first annular portion 111 is in contact with the voltage conducting layer 12 may not be limited to the above.

In the conductive lead, the second annular portion 112 surrounds the first annular portion 111 and is connected to the voltage connecting terminals 13. In an example, the second annular portion 112 can be indirectly connected to the two voltage connecting terminals 13 by two lead portions 114 in the conductive lead respectively as shown in FIG. 1. In another example, the second annular portion 112 is direct contact with all conductive pads (PIN) which are used as the voltage connecting terminals 13. In yet another example, the edge on one side of the second annular portion 112 is directly used as the voltage connecting terminal 13 for receiving voltage. It should be understood that the second annular portion 112 is a part of the conductive lead for conducting the voltage from the voltage connecting terminal 13 to the second end of the bridging portion 113, while the way of connecting between the second annular portion 112 and the voltage connecting terminal 13 may not be limited to the above.

In the conductive lead, each of the plurality of bridging portions 113 has a first end connected to the first annular portion 111 and a second end connected to the second annular portion 112. For example, as shown in FIG. 1, each bridging portion 113 extends in one of the upper, lower, left, and right directions. One end of each bridging portion 113 adjacent to the display region A1 is the first end connected to the first annular portion 111, and one end of each bridging portion 113 away from the display area A1 is the second end connected to the second annular portion 112. For example, the bridging portion 113 is a part of the conductive lead connected to the first annular portion 111 and the second annular portion 112, and the shape, the number, the size, the extending direction, the arrangement manner, etc. may not be limited to the form shown in FIG. 1.

The resistance value of the conductor part between the second end of each bridging portion 113 and the voltage connecting terminal 13 may have the following rule: the resistance value is negatively correlated to the resistance value of the bridging portion 113 between the first end and the second end. It is assumed that the resistance value between any position connecting the first annular portion 111 with the bridging portion 113 and the voltage connecting terminal 13 is R0, the resistance value between the second end of the bridging portion 113 and the voltage connecting terminal 13 is R2, and the resistance value between the first end and the second end of the bridging portion 113 is R1, then obviously R0=R1+R2. In the case where R1 and R2 of each bridging portion 113 are negatively correlated, R1 and R2 can be mutually compensated in size, to enable R0 to achieve the expected distribution. For example, the difference between R1 at different positions can be compensated by R2, so that R0 at various positions remains the same. For another example, the difference between R1 at different positions can be overcompensated by R2, so that R0 is negatively correlated to R1. As such, the first annular portion 111 can provide the voltage having an expected size distribution for the voltage conducting layer 12.

In an example, as shown in FIG. 1, all the bridging portions 113 are located between the first annular portion 111 and the second annular portion 112, and the distance between the first annular portion 111 and the second annular portion 112 is consistent at all positions. For example, the lengths of all the bridging portions 113 in the direction from the first end to the second end (i.e., the extending direction away from the display area A1, hereinafter referred to as the first direction) are the same. The material for forming the second annular portion 112 has a certain resistivity. Thus, for respective positions on the second annular portion 112, with the increase of distance from these positions to the voltage connecting terminal 13, the resistance value R1 between these positions and the voltage connecting terminal 13 increases, and the deviation amplitude of the actual voltage at the corresponding node from the original voltage also increases. As shown in FIG. 1, along the direction in which the resistance value R1 of the second annular portion 112 gradually increases, the length of the bridging portion 113 in the direction perpendicular to the first direction (hereinafter referred to as the second direction) also gradually increases. That is, among the plurality of bridging portions 113, the resistance value from the second end of the bridging portion 113 to the voltage connecting terminal 13 is positively correlated to the length of the bridging portion 113 in the second direction. It should be understood that, in the case where the resistivity, the thickness, and the length in the first direction are respectively the same for the plurality of bridging portions 113, the resistance value of the bridging portion 113 between the first end and the second end is negatively correlated to the length of the bridging portion 113 in the second direction. Therefore, the larger the resistance value R1 of the corresponding first end of the bridging portion 113 is, the smaller the resistance value R2 between the first end and the second end is.

In a comparative example, all the bridging portions 113 in FIG. 1 have the same length in the second direction, and thus the resistance values R2 of all the bridging portions 113 between the first end and the second end are the same. As such, the bridging portions 113 do not have the function of changing the voltage distribution. Generally, the deviation amplitude of the voltage at each position on the first annular portion 111 and the second annular portion 112 gradually increases as the position is away from the voltage connecting terminal 13, and the deviation amplitude of the voltage conducted to the voltage conducting layer 12 also gradually increases from top to bottom. When the voltage conducting layer 12 is used to conduct the cathode voltage of the light-emitting device, the above voltage distribution will be shown as gradual increase or gradual decrease of the overall display brightness from one side to the other side of the display area in the performance of the display product. In addition, this phenomenon is more obvious for the display product with a larger size of display area.

In contrast, in the exemplary structure shown in FIG. 1, the relationship among the voltage at various positions on the first annular portion 111 can be adjusted by the resistance value R2 of the bridging portions 113. For example, by changing the distribution of the resistance value of R2, the deviation amplitude of the voltages at the respective positions on the first annular portion 111 is enabled to be the same, so that the voltage conducting layer 12 receives uniformly-distributed voltage on the contact surface with the first annular portion 111. For another example, uneven brightness caused by other reasons may also be compensated by further changing the distribution of the resistance value R2 on the basis of compensating the difference between the deviation amplitude of the voltage caused by the resistance value R1. In an example, the voltage conducting layer 12 is used to conduct the cathode voltage of the light-emitting device. Since the anode voltage of the light-emitting device continuously decreases in the direction away from the power source terminal due to the resistance of the material, the decrease amplitude of the anode voltage at each position can be obtained by way of, for example, testing. The distribution of the resistance value R2 is then adaptively changed to adjust the distribution of the cathode voltage on the first annular portion 111, so as to compensate the decrease amplitude of the anode voltage. In one implementation, the connecting terminal of the anode voltage is disposed in the circuit area A22 together with the voltage connecting terminal 13, and the deviation amplitude of the anode voltage and the cathode voltage generally gradually increases toward the direction away from the circuit region A22. At this time, the voltage of the first annular portion 111 generally may be enabled to gradually decrease along the direction away from the circuit region by adjusting the resistance value R2 of each bridging portion 113. In addition, the relationship of the gradual decrease of the voltage of first annular portion 111 along with the position is consistent with the relationship of the anode voltage along with the position in the same direction. Therefore, the difference value between the anode voltage and the cathode voltage received by the plurality of light-emitting devices having the same color and display gray scale in such a direction remains the same.

It can be seen that according to the embodiment of the present disclosure, the amplitude decrease of the voltage during conduction can be compensated based on the structure and characteristics of the conductive lead, so that the conductive lead can provide the voltage conducting layer the voltage having expected amplitude distribution, which helps to improve the brightness uniformity of the self light-emitting display product. It should be understood that the expected amplitude distribution may be uniform distribution, or may be compensating amplitude distribution adapted to other brightness uniformity. In addition, the rising direction of the voltage deviation amplitude determined by the resistance value R1 does not change. Therefore, in order to compensate the non-uniform brightness caused by the resistance value R1, the change trend of the resistance value R2 along with the position is generally opposite to that of the resistance value R1 along with the position, that is, the negative correlation between the resistance value R1 and the resistance value R2 is formed.

It should be understood that the negative correlation between the resistance value R1 and the resistance value R2 refers to the opposite change trend on the whole, and does not need to be strictly embodied in the resistance value R1 and the resistance value R2 corresponding to each bridging portion 113. In an example, the plurality of adjacent bridging portions 113 has the same resistance value R1 from the first end to the second end. For example, n bridging portions 113 are a group (n is an integer greater than 1). All bridging portions 113 in each group all have the same shape and configuration, and the resistance value R2 (the averaged value) is negatively correlated to the resistance value R1 among the groups. In another example, part of the plurality of bridging portions 113 meet the value trend in which the resistance value R1 and the resistance value R2 are negatively correlated, while the other bridging portions 113 do not meet the value trend. For example, the bridging portions 113 at the central position close to one edge of the display area A1 have a smaller resistance value R2 than the bridging portions 113 at the surrounding positions, thereby helping compensate the brightness unevenness that the brightness at the central position is lower than the brightness at the surrounding positions of the display area A1

It should also be understood that FIG. 1 only illustrates part of the structures described above in a schematic diagram. For example, the actual shape of the structure of the lead electrode may be different from that shown in FIG. 1, and the display substrate may further include other structures which are not shown.

Figure 2:
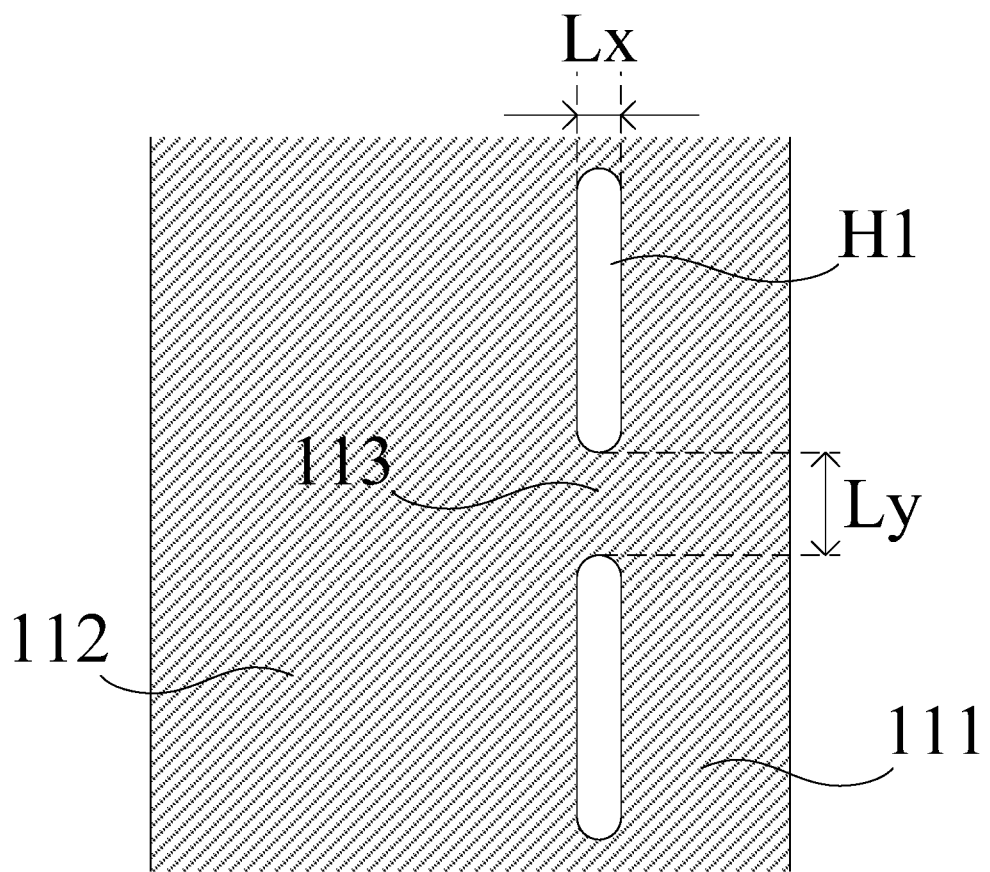
FIG. 2 and FIG. 3 are schematic diagrams of a portion of a conductive lead in a display substrate according to an embodiment of the present disclosure.
Figure 3:
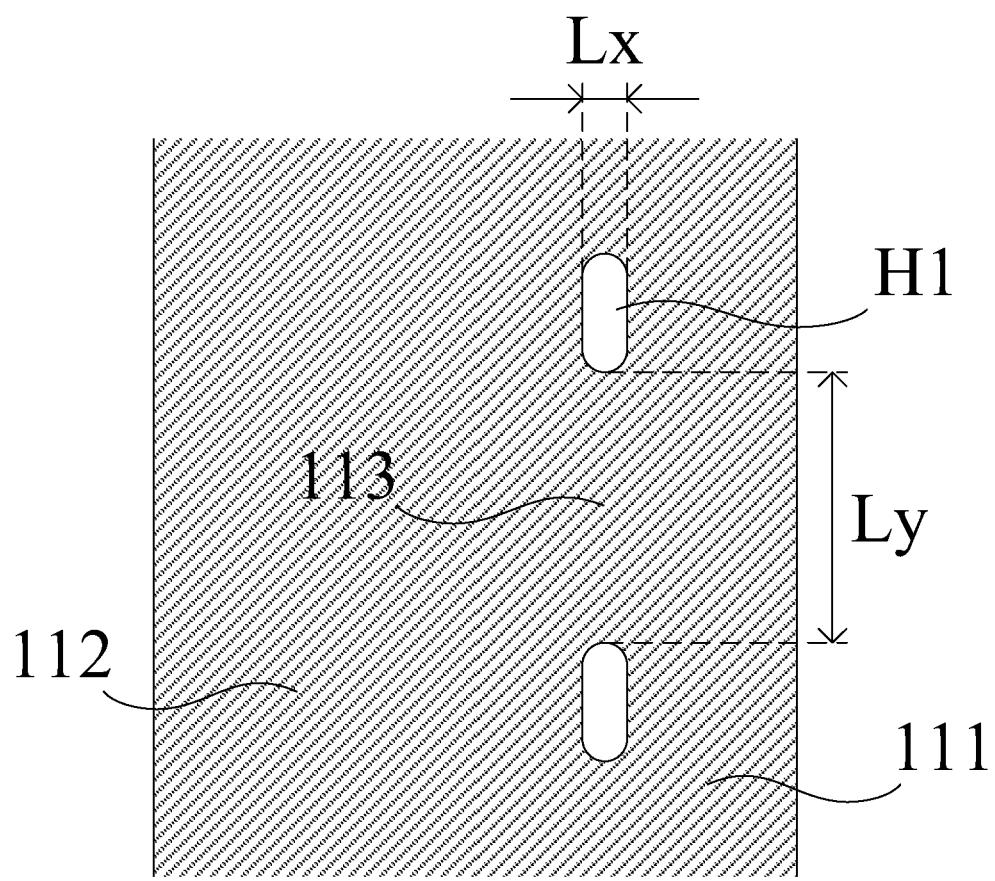

FIGS. 2 and 3 are schematic diagrams of a portion of a conductive lead within a display substrate in one embodiment of the present disclosure. In the present embodiment, the conductive lead as a whole is an annular wire made of a conductive material surrounding the display area A1 (ignoring the lead portions). Referring to FIG. 2 and FIG. 3, a plurality of fine holes H1 whose arrangement direction and the extending direction are both consistent with the extending direction of the conductive lead are disposed in the conductive lead. The conductive lead at the inner side of the annular area formed by the plurality of fine holes H1 arranged along the arrangement direction is the first annular portion 111. The conductive lead at the outer side of the annular area formed by the plurality of fine holes H1 arranged along the arrangement direction is the second annular portion 112, and the part between adjacent thin holes is the bridging portion 113. As shown in FIG. 2 and FIG. 3, the length Lx of the bridging portion 113 in the first direction is the width of the above fine hole H1, and the length Ly of the bridging portion 113 in the second direction is the distance between the adjacent fine holes H1. By comparing FIG. 2 with FIG. 3, it can be known that the bridging portion 113 having a larger Ly and a larger R2 can be obtained when the distance between the fine holes is large, and the same Lx can be realized for different bridging portions 113 when the fine holes have the same width. Thus, the above conductive lead can be achieved by designing the annular wire and the shape, size, position, arrangement, and the like of the fine holes H1 in the annular wire when designing the pattern of a certain conductive material layer structure in the display substrate.

Figure 4:
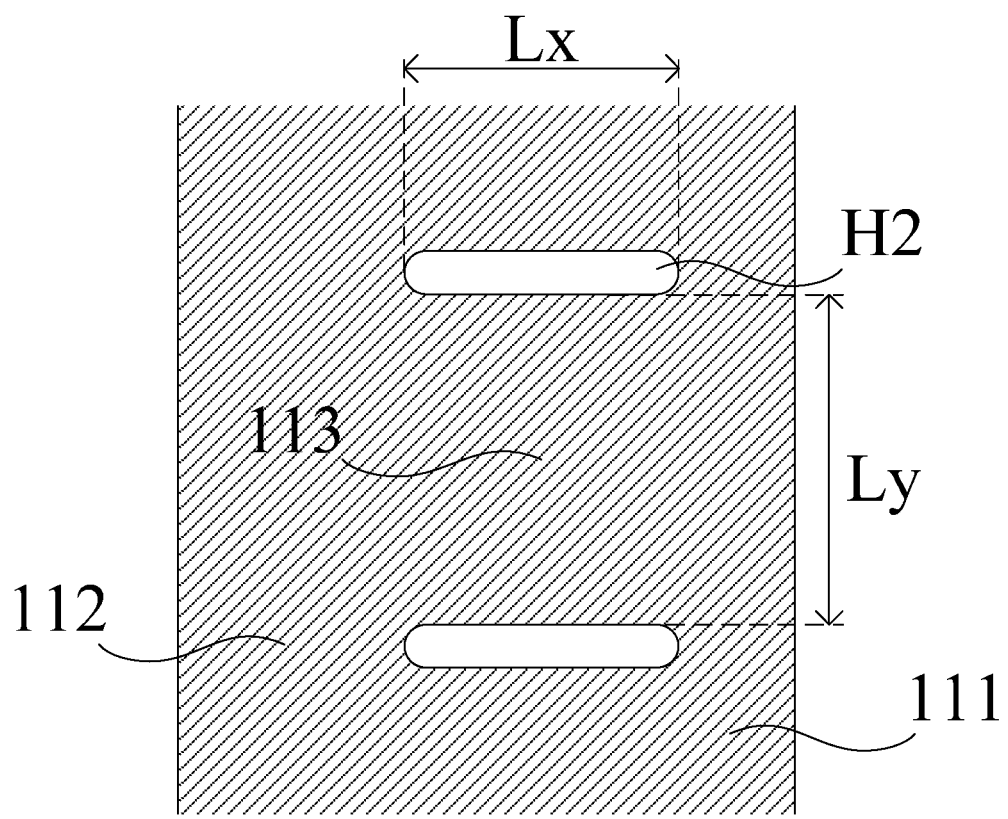
FIG. 4 and FIG. 5 are schematic diagrams of a portion of a conductive lead in a display substrate according to another embodiment of the present disclosure.
Figure 5:
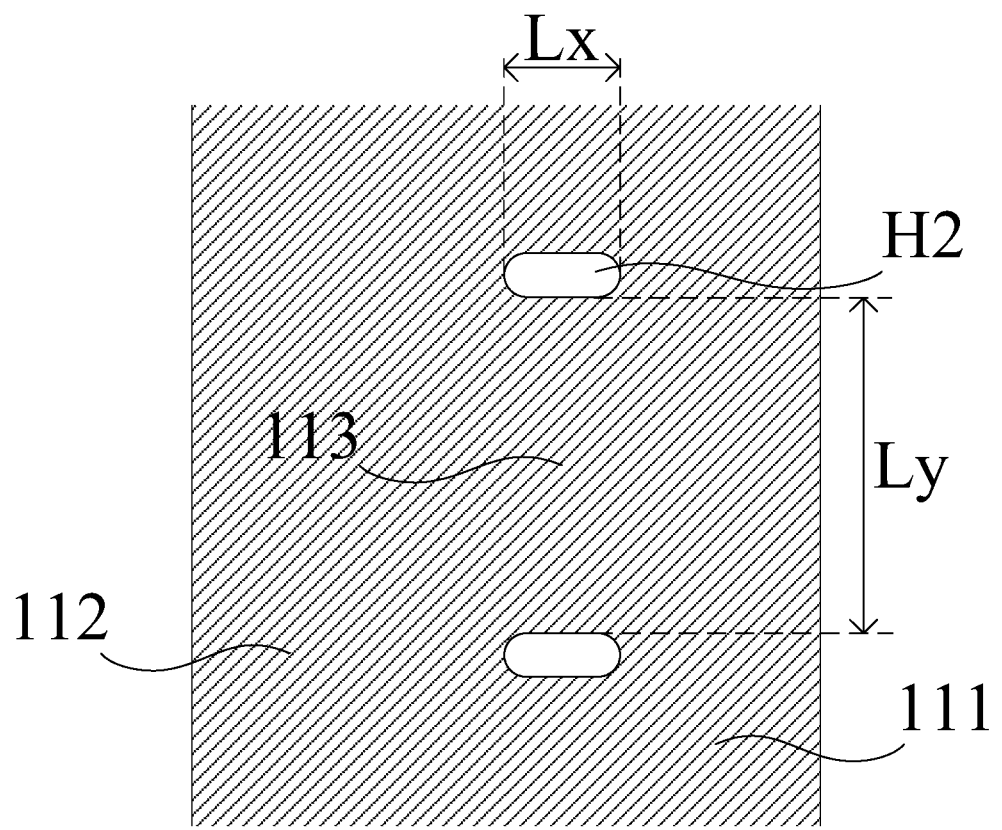

FIGS. 4 and 5 are schematic diagrams of part of a conductive lead within a display substrate in one embodiment of the present disclosure. In the present embodiment, the conductive lead as a whole is an annular wire made of a conductive material surrounding the display area A1 (ignoring the lead portions). Referring to FIG. 4 and FIG. 5, a plurality of fine holes H2 whose arrangement direction is consistent with the extending direction of the conductive lead and extending direction is consistent with the width direction of the conductive lead are disposed in the conductive lead. The conductive lead at the inner side of the annular area formed by the plurality of fine holes H2 arranged along the arrangement direction is the first annular portion 111. The conductive lead at the outer side of the annular area formed by the plurality of fine holes H2 arranged along the arrangement direction is the second annular portion 112, and the part between adjacent thin holes H2 is the bridging portion 113. As shown in FIG. 4 and FIG. 5, the length Lx of the bridging portion 113 in the first direction is the width of the above fine hole H2, and the length Ly of the bridging portion 113 in the second direction is the distance between the adjacent fine holes H2. By comparing FIG. 4 with FIG. 5, it can be known that the bridging portion 113 having a larger Ly and a smaller R2 can be obtained when the fine hole has a larger length, and different bridging portions 113 can have the same Lx when the fine holes have the same distance therebetween. Thus, the above conductive lead can be achieved by designing the annular wire and the shape, size, position, arrangement, and the like of the fine holes H2 in the annular wire when designing the pattern of a certain conductive material layer structure in the display substrate.

Figure 6:
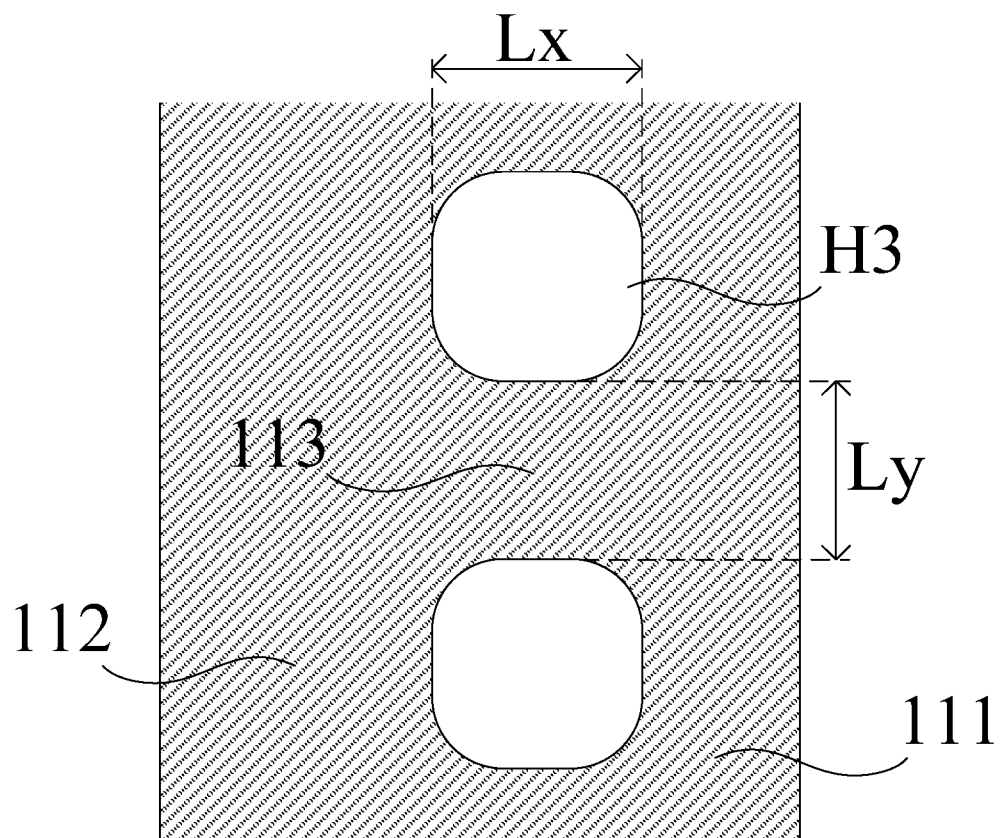
FIG. 6 and FIG. 7 are schematic diagrams of a portion of a conductive lead in a display substrate according to yet another embodiment of the present disclosure.
Figure 7:
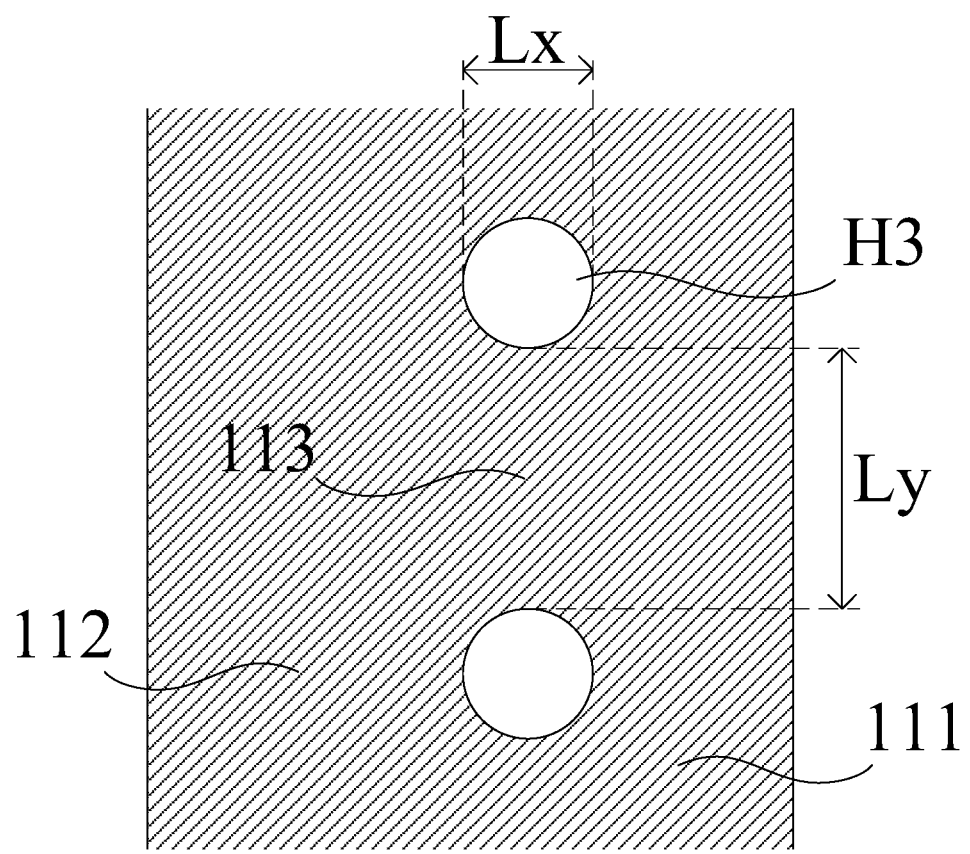

FIGS. 6 and 7 are schematic diagrams of part of a conductive lead within a display substrate in one embodiment of the present disclosure. In the present embodiment, the conductive lead as a whole is an annular wire made of a conductive material surrounding the display area A1 (ignoring the lead portions). Referring to FIG. 6 and FIG. 7, a plurality of via holes H3 whose arrangement direction is consistent with the extending direction of the conductive lead are disposed in the conductive lead. The conductive lead at the inner side of the annular area formed by the plurality of via holes H3 arranged along the arrangement direction is the first annular portion 111. The conductive lead at the outer side of the annular area formed by the plurality of via holes H3 arranged along the arrangement direction is the second annular portion 112, and the part between adjacent thin holes is the bridging portion 113. As shown in FIG. 6 and FIG. 7, the length Lx of the bridging portion 113 in the first direction is the length of the above via hole H3 in the direction perpendicular to the extending direction of the conductive lead, and the length Ly of the bridging portion 113 in the second direction is the distance between the adjacent via holes H3. By comparing FIG. 6 with FIG. 7, it can be known that the bridging portion 113 having a larger Lx, a smaller Ly and a larger R2 can be obtained when the via hole has a larger diameter. Thus, the above conductive lead can be achieved by designing the annular wire and the shape, size, position, arrangement, and the like of the fine holes H3 in the annular wire when designing the pattern of a certain conductive material layer structure in the display substrate.

It should be understood that the implementation of the conductive lead may not be limited to the above examples. For example, the fine holes H1, the fine holes H2, and the via holes H3 are all structures that penetrate through the film layer where the conductive lead is, but may also be configured to be blind holes or buried holes in the case that other aspects are not changed, to realize the above negative correlation between the resistance value R1 and the resistance value R2 as well.

It should also be understood that the above descriptions illustrate three examples of ways of setting the resistance value R2 of the bridging portion 113. That is, the length of the bridging portion 113 in the second direction is set to obtain the expected resistance value R2, the length of the bridging portion 113 in the first direction is set to obtain the expected resistance value R2, and the length of the bridging portion in the first direction and the length of the bridging portion in the second direction are set to obtain the expected resistance value R2. Exemplarily, other ways of setting the resistance value R2 of the bridging portion 113 can also be obtained with reference to the above examples based on the law of resistance, without being limited to the above examples. It should be noted that although the above description is illustrated by taking an example in which the bridging portion 113 is between the first annular portion 111 and the second annular portion 112, the implementation of the corresponding technical solution is not dependent thereon. For example, when the bridging portion 113 partially overlaps with at least one of the first annular portion 111 and the second annular portion 112 (the bridging portion 113 and the two annular portions are in different layers), and when the bridging portion 113 is partially located inside the first annular portion 111 and/or outside the second annular portion 112, the negative correlation between the resistance value R1 and the resistance value R2 can still be achieved. It should be understood that it is more advantageous to reduce the layout space occupied by the conductive lead in the display substrate by disposing the bridging portion 113 between the first annular portion 111 and the second annular portion 112.

It should be noted that although the above descriptions are illustrated by taking the closed annular shape as the shapes of the first annular portion 111 and the second annular portion 112 as an example, as the conduction of the voltage does not depend on the closed first annular portion 111 or the closed second annular portion 112, the voltage conduction between the voltage connecting terminal 13 and the voltage conducting layer 12 can still be realized even though at least one of the first annular portion 111 and the second annular portion 112 is changed to be of an unclosed shape. It should be understood that by setting the shape of at least one of the first annular portion 111 and the second annular portion 112 to a closed annular shape, it is favorable to avoid a relatively large potential difference between the positions that are disconnected from each other, and thus it helps to improve the display uniformity.

Figure 8:
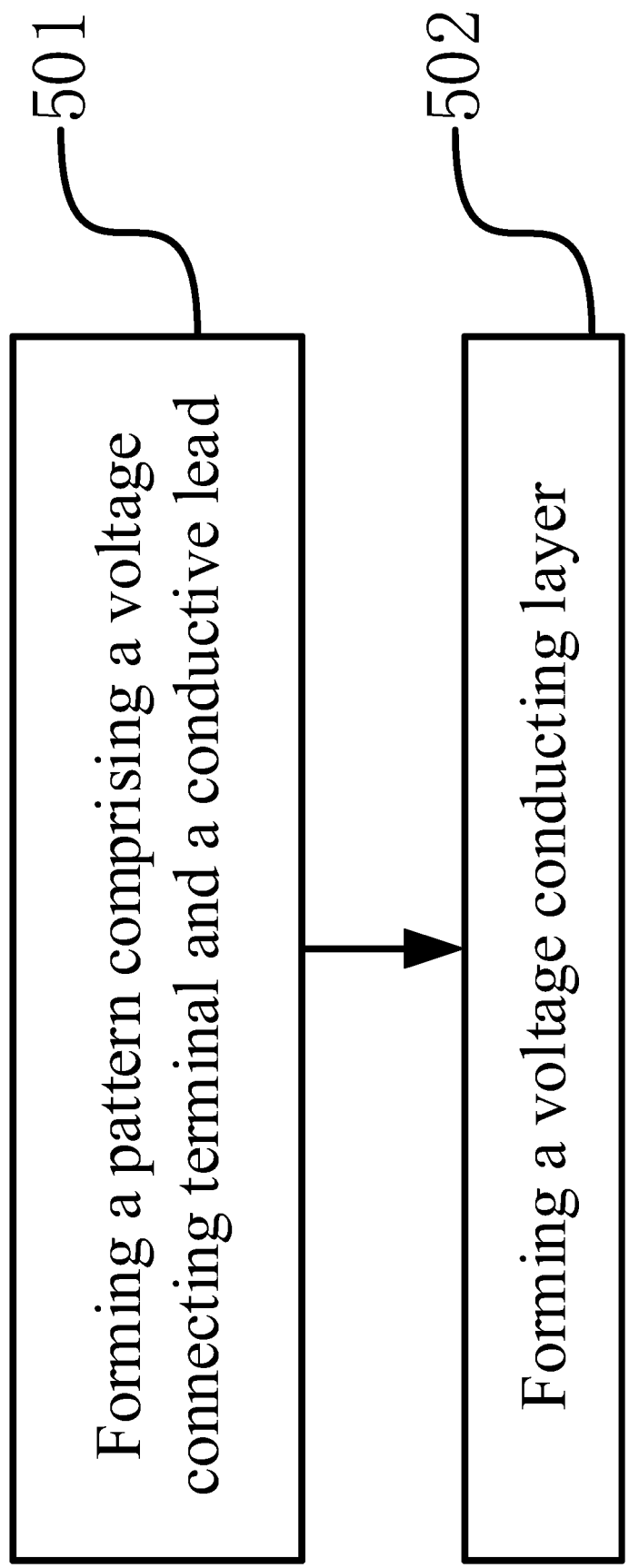
FIG. 8 is a flow chart of steps in a method for manufacturing a display substrate according to an embodiment of the present disclosure.

FIG. 8 is a flow chart of steps in a method for manufacturing a display substrate according to an embodiment of the present disclosure. The display substrate may be any of the above display substrates and includes a display area and a peripheral circuit area, wherein the peripheral circuit area surrounds the display area. Referring to FIG. 8, the manufacturing method includes the following steps.

In step 501, a pattern comprising a voltage connecting terminal and a conductive lead is formed.

The voltage connecting terminal and the conductive lead are both located in the peripheral circuit area. The material for forming the voltage connecting terminal and the conductive lead may a metal material comprising, for example, at least one of iron, copper, aluminum, molybdenum, nickel, titanium, silver, zinc, tin, lead, chromium, and manganese, and can be set according to the expected electrical conductivity. The conductive lead includes: a first annular portion surrounding the display area and connected to the voltage conducting layer; a second annular portion surrounding the first annular portion and connected to the voltage connecting terminal; and a plurality of bridging portions. The first end of each of the bridging portions is connected to the first annular portion, a second end of each of the bridging portions is connected to the second annular portion, and the resistance value between the first end and the second end of the bridging portion is negatively correlated to the resistance value from the second end of the bridging portion to the voltage connecting terminal.

In step 502, a voltage conducting layer is formed.

At least a part of the voltage conducting layer is located in the display area, and the material for forming the voltage conducting layer may be a transparent conductive material comprising, for example, at least one of indium tin oxide (ITO), graphene, metal mesh, conductive polymer and nano conductive material, and may also be a translucent conductive material such as a silver thin film, and may not be limited thereto.

It should be noted that the order of the above steps 501 and 502 may be exchanged. For example, in the manufacturing process for a top-emitting OLED display panel and a bottom-emitting OLED display panel which have substantially the same components, the order the above steps 501 and 502 can be exchanged.

It should be noted that, in accordance with the related description of any of the above display substrates, the corresponding structure may be fabricated in a manner corresponding to the shape and/or the configuration, which is not repeated in detail herein again.

It can be known from the above that the embodiments of the present disclosure can compensate the amplitude decrease of the voltage during conduction based on the structure and characteristics of the conductive lead, such that the conductive lead can provide the voltage conducting layer voltage having the expected amplitude distribution, which helps to improve the brightness uniformity of the self light-emitting display product.

Figure 9:
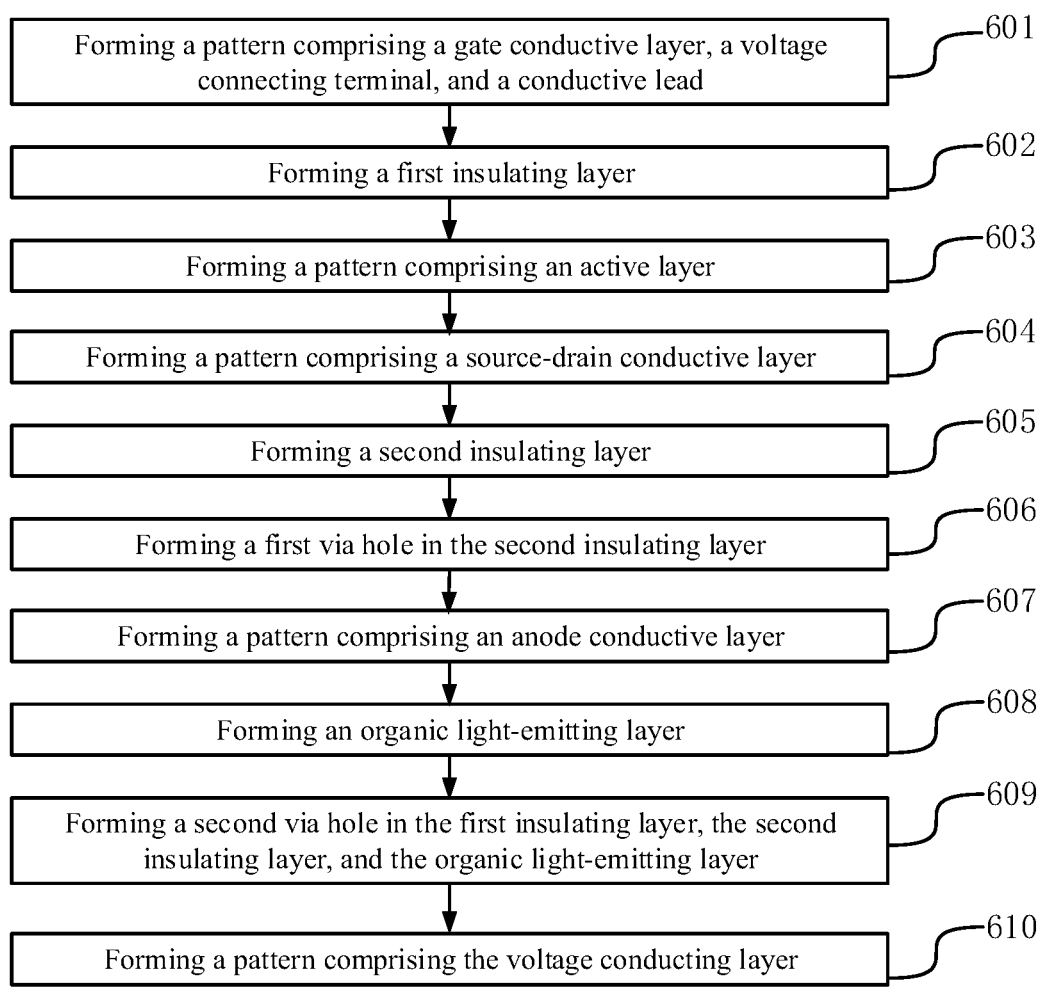
FIG. 9 is a flow chart of steps in a method for manufacturing a display substrate according to another embodiment of the present disclosure.
Figure 10:
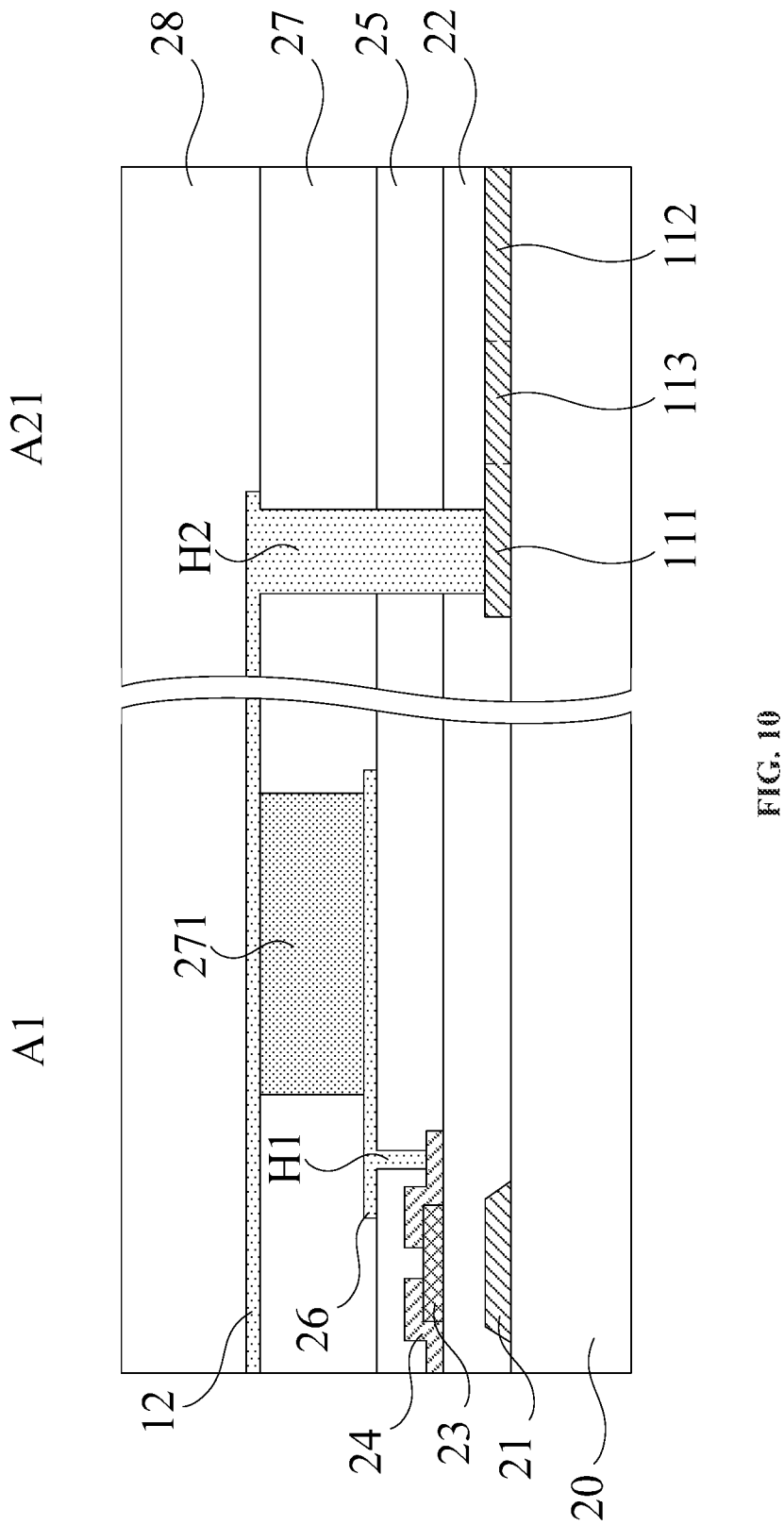
FIG. 10 is a schematic diagram of a structure of a display substrate in a thickness direction according to an embodiment of the present disclosure.

FIG. 9 is a flow chart of the steps in a method for manufacturing a display substrate according to another embodiment of the present disclosure. FIG. 10 is a schematic diagram of a structure of a display substrate in a thickness direction which is manufactured through the steps shown in FIG. 9. Referring to FIG. 9, the method for manufacturing a display substrate according to the present embodiment includes the following steps.

In step 601, a pattern comprising a gate conductive layer, a voltage connecting terminal, and a conductive lead is formed.

In an example, this step includes: after cleaning and drying the surface of a base substrate 20 (made of a material such as glass, silicon wafer, organic polymer such as polyimide, etc.), depositing a layer of metal material film with a metal material on the surface of the base substrate 20 through a physical vapor deposition process (PVD), and the parameters such as the thickness of the film layer can be set by, for example, adjusting the relevant process parameters. On such basis, the metal material film distributed on the entire surface is patterned. A layer of photoresist is coated on the unpatterned metal material film by, for example, spin coating (here, the positive photoresist is taken as an example for illustration). All the photoresist in the area to be etched is irradiated with ultraviolet light through a mask plate such to enable the photoresist to be fully exposed, and then the photoresist is placed in a developing solution to completely remove the photoresist in the area to be etched through development. The unpatterned gate conductive layer is etched by the remaining photoresist as a mask, and the remaining photoresist is removed after the etching is completed. As an example, FIG. 10 illustrates a conductive material layer comprising the gate conductive layer 21, as well as the first annular portion 111, the second annular portion 112, and the bridging portion 113 in a conductive lead. It can be seen that the gate conductive layer 21 is located in the display area A1, and the conductive lead is located in the peripheral area A21.

In step 602, a first insulating layer is formed.

In an example, this step includes depositing a gate insulating layer (as a first insulating layer 22) covering the base substrate 20 and the conductive material layer on the base substrate 20 and the conductive material layer by a chemical vapor deposition (CVD) process, wherein the film thickness of the gate insulating layer may need to meet the relevant requirements on the thickness of the gate insulating layer of a thin film transistor, and the parameters, such as the thickness, of the film layer can be set by, for example, adjusting the relevant process parameters. As an example, the first insulating layer 22 is arranged in the entire the display area in FIG. 10, and a part of the first insulating layer 22 is located in the peripheral area A21.

In step 603, a pattern comprising an active layer is formed.

In an example, this step includes forming a semiconductor material layer on the first insulating layer 22 and patterning the semiconductor material layer, to form an active layer 23 having an expected pattern. The semiconductor material for forming the active layer may include amorphous silicon, polycrystalline silicon, monocrystalline silicon, metal oxide semiconductor or the like, and at least a part of the area may be doped based on the characteristics of the thin film transistor to be achieved. As an example, the active layer 23 in FIG. 10 is located in the display area A1 and overlaps with the gate conductive layer 21.

In step 604, a pattern comprising a source-drain conductive layer is formed.

In an example, this step includes depositing an unpatterned source-drain conductive layer 24 with a metal material by the physical vapor deposition process on the first insulating layer 22 and the active layer 23. The parameters, such as the thickness, of the film layer can be set by, for example, adjusting the relevant process parameters. On such basis, the source-drain conductive layer 24 distributed on the whole surface is patterned. A layer of photoresist is coated on the unpatterned source-drain conductive layer 24 by, for example, spin coating (here, positive photoresist is taken as an example for illustration). All the photoresist in the area to be etched is irradiated with ultraviolet light through a mask plate to enable the photoresist to be fully exposed, and then the photoresist is placed in a developing solution to completely remove the photoresist in the area to be etched through development. The unpatterned source-drain conductive layer 24 is etched by the remaining photoresist as a mask, and the remaining photoresist is removed after the etching is completed. As an example, the source-drain conductive layer 24 in FIG. 10 is located in the display area A1 and comprises two parts respectively which are in contact with the active layer 23 at different positions and are used as the source electrode and the drain electrode of the thin film transistor respectively.

In step 605, a second insulating layer is formed.

In an example, this step includes depositing a passivation layer (as a second insulating layer 25) covering the first insulating layer 22, the active layer 23, and the source-drain conductive layer 24 on the first insulating layer 22, the active layer 23, and the source-drain conductive layer 24 by the chemical vapor deposition process. As an example, the second insulating layer 25 is arranged in the entire display area A1 in FIG. 10, and a part of the second insulating layer 25 is located in the peripheral area A21.

In step 606, a first via hole is formed in the second insulating layer.

In an example, this step includes coating a layer of photoresist on the second insulating layer 25 by, for example, spin coating. All the photoresist in the via hole area is irradiated with ultraviolet light through a mask plate to enable the photoresist to be fully exposed, and then the photoresist is placed in a developing solution to completely removed the photoresist in the via hole area through development. The second insulating layer 24 is etched by the remaining photoresist as a mask, and the remaining photoresist is removed after the etching is completed. As an example, the first via hole H1 in FIG. 10 is at a position where the source-drain electrode layer 24 needs to be connected to other structures. As another example, the second via hole H2 in the first insulating layer 22 and the second insulating layer 25 in FIG. 10 (located in the peripheral area A21 for forming the contact connection between the voltage conducting layer 12 and the first annular portion 111) may be formed in the above process together with the first via hole H1.

In step 607, a pattern comprising an anode conductive layer is formed.

In an example, this step includes depositing an unpatterned anode conductive layer 26 on the second insulating layer 25 with a transparent conductive material by the physical vapor deposition process, and the parameters, such as the thickness, of the film layer can be set, for example, by adjusting the relevant process parameters. On such basis, the anode conductive layer 26 distributed on the whole surface is patterned. A layer of photoresist is coated on the unpatterned anode conductive layer 26 by, for example, spin coating (here, positive photoresist is taken as an example for illustration). All the photoresist in the area to be etched is irradiated with ultraviolet light through a mask plate to enable the photoresist to be fully exposed, and then the photoresist is placed in a developing solution to completely remove the photoresist in the area to be etched through development. The unpatterned anode conductive layer 26 is etched by the remaining photoresist as a mask, and the remaining photoresist is removed after the etching is completed. As an example, the anode conductive layer 26 in FIG. 10 is located in the display area A1 and is in contact connection with the source-drain conductive layer 24 via the first via hole H1. As another example, a part of the anode conductive layer 26 is located in the second via hole H2 formed in the above step, thereby helping form the contact connection between the voltage conducting layer 12 and the first annular portion 111 by the same transparent conductive material as the voltage conducting layer 12.

In step 608, an organic light-emitting layer is formed.

In an example, the organic light-emitting layer includes a hole injection layer, a hole transport layer, an electron blocking layer, a light-emitting layer, a hole blocking layer, an electron transport layer, and an electron injection layer which are sequentially laminated. Here, the light-emitting layer includes a red light-emitting layer, a green light-emitting layer and a blue light-emitting layer which are distributed in a plurality of sub-pixel regions of the display substrate, respectively. As an example, the above organic light-emitting layer may be formed by using any process for manufacturing an organic light-emitting diode. As an example, a part of the organic light-emitting layer 271 (in the display region A1) between the anode conductive layer 26 and the voltage conducting layer 12 in FIG. 10 can receive carriers from two sides in the thickness direction and emit the light of an expected color by excitons formed by carrier recombination. The organic light-emitting layer 27 in the peripheral area A21 does not include a light-emitting layer, and is arranged as an interlayer dielectric between the second insulating layer 25 and the third insulating layer 28.

In step 609, a second via hole is formed in the first insulating layer, the second insulating layer, and the organic light-emitting layer.

In an example, this step includes coating a layer of photoresist on the organic light-emitting layer by, for example, spin coating. All the photoresist in the via hole area is irradiated with ultraviolet light through a mask plate to enable the photoresist to be fully exposed, and then the photoresist is placed in a developing solution to completely remove the photoresist in the via hoe area through development. The first insulating layer 22 and the second insulating layer 25 are etched by the remaining photoresist as a mask, and the remaining photoresist is removed after the etching is completed. As an example, the second via hole H2 in FIG. 10 is located in an area (in the peripheral area A21) where the voltage conducting layer 12 overlaps with the first annular portion 111. As another example, in a case where a part of the second via hole H2 has been formed in the first insulating layer 22 and the second insulating layer 25, the organic light-emitting layer 27 may only be etched in the above process to manufacture the remaining part of the second via hole H2.

In step 610, a pattern comprising the voltage conducting layer is formed.

In an example, this step includes depositing an unpatterned voltage conducting layer 12 on the organic light-emitting layer with a transparent conductive material by using the physical vapor deposition process, and the parameters, such as the thickness, of the film layer can be adjusted by, for example, adjusting the relevant process parameters. On such basis, the transparent conductive material distributed on the whole surface is patterned. A layer of photoresist is coated on the unpatterned voltage conducting layer 12 by, for example, spin coating (here, positive photoresist is taken as an example for illustration). All the photoresist in the area to be etched is irradiated with ultraviolet light through a mask plate to enable the photoresist to be fully exposed, and then the photoresist is placed in a developing solution to completely remove the photoresist in the area to be etched through development. The unpatterned voltage conducting layer 12 is etched by the remaining photoresist as a mask, and the remaining photoresist is removed after the etching is completed. As an example, a part of the voltage conducting layer 12 in FIG. 10 is located in the display area A1, a part of the voltage conducting layer 12 is located in the peripheral area A21, and the voltage conducting layer 12 is in contact connection with the first annular portion 111 via the second via hole H2.

In step 611, a third insulating layer is formed.

In an example, this step includes a process of depositing a planarization layer (as the third insulating layer 28) covering the organic light-emitting layer and the voltage conducting layer by the chemical vapor deposition process on the organic light-emitting layer and the voltage conducting layer. As an example, the upper surface of the third insulating layer 28 in FIG. 10 is a side surface of the display substrate, and plays a role of protecting and planarizing other structures below.

It can be seen that any of the above display substrates can be formed by the above steps, and a self light-emitting display product such as an organic light-emitting diode display panel can be formed. It should be noted that the above is described by taking an example in which the conductive lead and the gate conductive layer 21 are formed through the same mask process. While, the conductive lead may actually be formed by the same mask process together with the source-drain conductive layer 24. Alternatively, a part of the conductive lead and the gate conductive layer 21 are formed by a single mask process, and a part of the conductive lead and the source-drain conductive layer 24 are formed by the same mask process, and may not be limited thereto. It should be understood that by simultaneously manufacturing the conductive lead and the gate conductive layer 21, and/or the source-drain conductive layer 24, it is favorable to simplify the flow of steps for the display substrate. In addition, although it is more favorable to simplify the process of manufacturing the conductive lead by forming each part of the conductive lead from the same material, the respective parts of the conductive lead are not necessarily formed from the same material. Moreover, generally, the thickness of each part of the conductive lead formed in a single mask process is the same on the display substrate, but the resistance of partial area of the conductive lead can also be reduced by, for example, laminating a plurality of layers of conductive materials, thereby achieving the negative correlation between the resistance value R1 and the resistance value R2.

Figure 11:
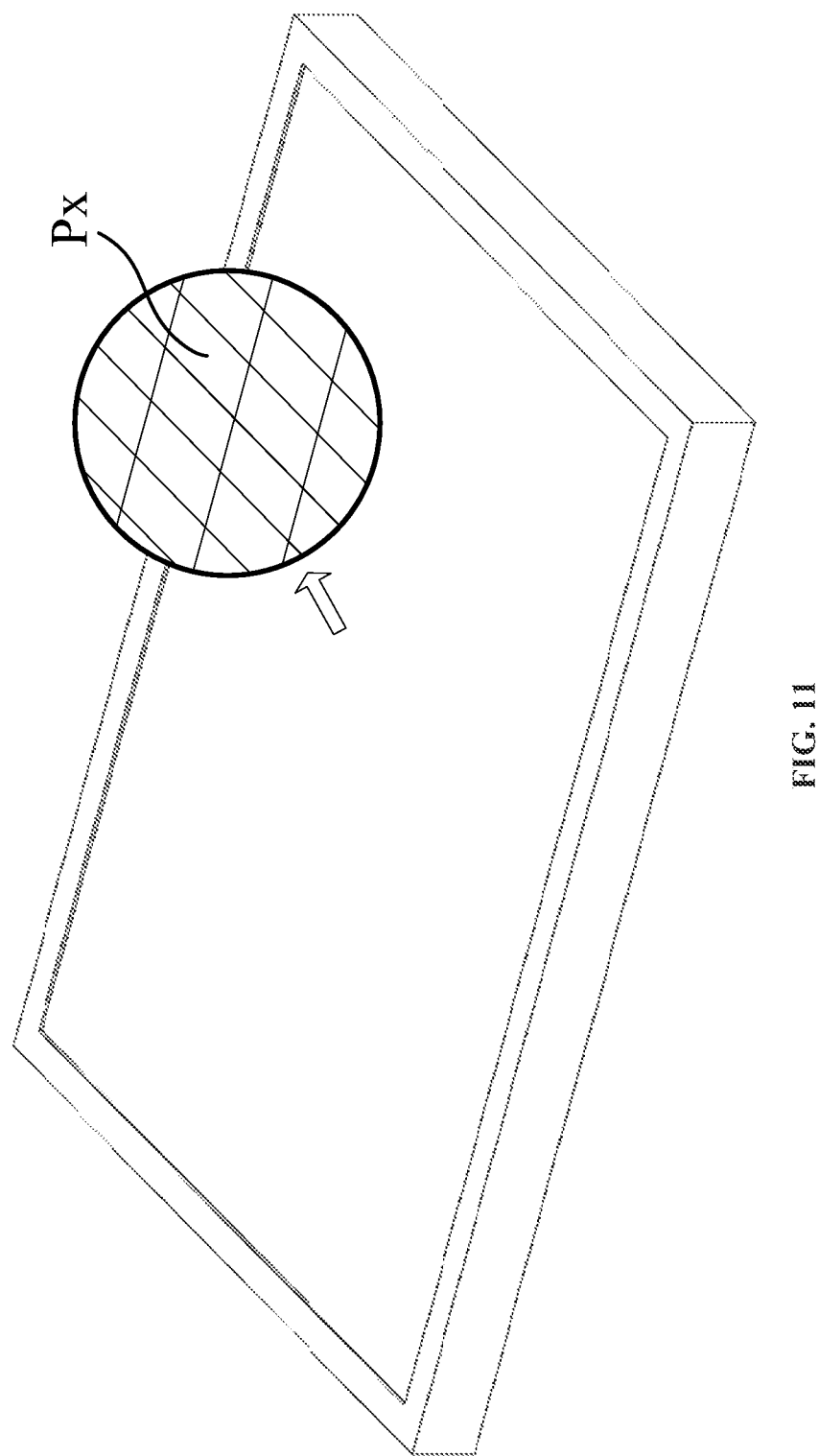
FIG. 11 is a schematic diagram of a structure of a display device according to an embodiment of the present disclosure.

Based on the same concept of disclosure, embodiments of the present disclosure provides a display device, including any of the above display substrates. The display device in the embodiments of the present disclosure may be any product or part having a display function, such as a display panel, a mobile phone, a tablet computer, a television, a display, a notebook computer, a digital photo frame and a navigator. As an example, FIG. 11 is a schematic diagram of a structure of a display device according to an embodiment of the present disclosure. The display device includes any of the above display substrates, and sub-pixel regions Pxs are disposed in rows and columns in the display area of the display substrate. The display device also has the corresponding advantages based on the advantages of the display substrate included therein.

It should be noted that, for the sake of clarity, only the structures for illustrating the technical solution are shown in the accompanying drawings of the present disclosure. In an actual product, addition, deletion or variation may be made on the basis of the accompanying drawings of the present disclosure to the extent possible, without affecting the implementation of the technical solution.

The foregoing descriptions are only exemplary embodiments of the present disclosure, and are not intended to limit the present disclosure. Within the spirit and principles of the present disclosure, any modifications, equivalent substitutions, improvements, etc., are within the protection scope of the present disclosure.

What is claimed is:

1. A display substrate, comprising:
    a voltage conducting layer, at least part of the voltage conducting layer being located in a display area;
    a voltage connecting terminal located within a peripheral circuit area, the peripheral circuit area surrounding the display area; and
    a conductive lead located within the peripheral circuit area;
    wherein, the conductive lead comprises:
    a first annular portion surrounding the display area and connected to the voltage conducting layer;
    a second annular portion surrounding the first annular portion and connected to the voltage connecting terminal; and
    a plurality of bridging portions, wherein a first end of each of the bridging portions is connected to the first annular portion, a second end of each of the bridging portions is connected to the second annular portion, and a resistance value between the first end and the second end of each of the bridging portions is negatively correlated to a resistance value between the second end of the respective bridging portion and the voltage connecting terminal.

2. The display substrate according to claim 1, wherein the resistance value between the second end of each of the bridging portions and the voltage connecting terminal is negatively correlated to a length of the bridging portion in a first direction, and the first direction is a direction from the first end of the bridging portion to the second end of the bridging portion.

3. The display substrate according to claim 1, wherein the resistance value between the second end of each of the bridging portions and the voltage connecting terminal is positively correlated to a length of the bridging portion in a second direction, the second direction is a direction perpendicular to a first direction, and the first direction is a direction from the first end of the bridging portion to the second end of the bridging portion.

4. The display substrate according to claim 1, further comprising at least one of a gate conductive layer and a source-drain conductive layer, and at least one of the gate conductive layer and the source-drain conductive layer and at least part of the conductive lead are formed by a same mask process.

5. The display substrate according to claim 1, wherein each of the bridging portions is located between the first annular portion and the second annular portion.

6. The display substrate according to claim 1, wherein part of the voltage conducting layer is located in the peripheral circuit area, and a surface of one side of the first annular portion in a thickness direction is in contact with a surface of one side of the voltage conducting layer in the thickness direction.

7. The display substrate according to claim 1, wherein the first annular portion is in direct contact with the voltage conducting layer, and the second annular portion is in direct contact with the voltage connecting terminal.

8. The display substrate according to claim 1, wherein the conductive lead further comprises at least one lead portion, and the at least one lead portion connects the second annular portion to the voltage connecting terminal.

9. The display substrate according to claim 1, wherein at least one of the first annular portion and the second annular portion has a closed annular shape.

10. The display substrate according to claim 1, wherein each part of the conductive lead is formed with a same material.

11. The display substrate according to claim 10, wherein each part of the conductive lead has the same thickness on the display substrate.

12. The display substrate according to claim 1, wherein the voltage conducting layer covers the entire display area.

13. A method for manufacturing a display substrate, comprising:
    forming a pattern comprising a voltage connecting terminal and a conductive lead, wherein the voltage connecting terminal and the conductive lead are both located in a peripheral circuit area of the display substrate; and
    forming a voltage conducting layer, at least part of the voltage conducting layer being located in a display area of the display substrate, the peripheral circuit area surrounding the display area;
    wherein the conductive lead comprises:
    a first annular portion surrounding the display area and connected to the voltage conducting layer;
    a second annular portion surrounding the first annular portion and connected to the voltage connecting terminal; and
    a plurality of bridging portions, wherein a first end of each of the bridging portions is connected to the first annular portion, a second end of each of the bridging portions is connected to the second annular portion, and a resistance value between the first end and the second end of each of the bridging portions is negatively correlated to a resistance value between the second end of the respective bridging portion and the voltage connecting terminal.

14. The method according to claim 13, wherein the resistance value between the second end of each of the bridging portions and the voltage connecting terminal is negatively correlated to a length of the bridging portion in a first direction, and the first direction is a direction from the first end of the bridging portion to the second end of the bridging portion.

15. The method according to claim 13, wherein the resistance value between the second end of each of the bridging portions and the voltage connecting terminal is positively correlated to a length of the bridging portion in a second direction, the second direction is a direction perpendicular to a first direction, and the first direction is a direction from the first end of the bridging portion to the second end of the bridging portion.

16. The method according to claim 13, wherein the display substrate further comprises at least one of a gate conductive layer and a source-drain conductive layer, and at least one of the gate conductive layer and the source-drain conductive layer and at least part of the conductive lead are formed by a same mask process.

17. A display device, comprising the display substrate according to claim 1.

18. The display device according to claim 17, wherein the resistance value between the second end of each of the bridging portions and the voltage connecting terminal is negatively correlated to a length of the bridging portion in a first direction, and the first direction is a direction from the first end of the bridging portion to the second end of the bridging portion.

19. The display device according to claim 17, wherein the resistance value between the second end of each of the bridging portions and the voltage connecting terminal is positively correlated to a length of the bridging portion in a second direction, the second direction is a direction perpendicular to a first direction, and the first direction is a direction from the first end of the bridging portion to the second end of the bridging portion.

20. The display device according to claim 17, wherein the display substrate further comprises at least one of a gate conductive layer and a source-drain conductive layer, and at least one of the gate conductive layer and the source-drain conductive layer and at least part of the conductive lead are formed by a same mask process.

* * * * *